(12) United States Patent
Park et al.

(10) Patent No.: US 12,013,327 B2
(45) Date of Patent: Jun. 18, 2024

(54) FLOW CELL DEVICE

(71) Applicants: ZEUS CO., LTD., Hwaseong-si (KR); ZEUS ENP CO., LTD., Sejong-si (KR)

(72) Inventors: Hyun Kook Park, Ansan-si (KR); Seong Hwan Park, Cheongju-si (KR)

(73) Assignees: ZEUS CO., LTD., Hwaseong-si (KR); ZEUS ENP CO., LTD., Sejong-si (KR)

( * ) Notice: Subject to any disclaimer, the term of this patent is extended or adjusted under 35 U.S.C. 154(b) by 0 days.

(21) Appl. No.: 17/268,158

(22) PCT Filed: Mar. 20, 2020

(86) PCT No.: PCT/KR2020/003823
§ 371 (c)(1),
(2) Date: Feb. 12, 2021

(87) PCT Pub. No.: WO2020/230996
PCT Pub. Date: Nov. 19, 2020

(65) Prior Publication Data
US 2022/0349814 A1     Nov. 3, 2022

(30) Foreign Application Priority Data

May 13, 2019 (KR) .................. 10-2019-0055828

(51) Int. Cl.
| | | |
|---|---|---|
| *G01N 21/05* | (2006.01) | |
| *G01N 15/00* | (2006.01) | |
| *G01N 15/06* | (2006.01) | |
| *G01N 15/075* | (2024.01) | |

(Continued)

(52) U.S. Cl.
CPC ............ *G01N 15/06* (2013.01); *G01N 21/05* (2013.01); *G01N 21/31* (2013.01); *H01L 21/67253* (2013.01); *G01N 2015/0053* (2013.01); *G01N 15/075* (2024.01); *G01N 2021/054* (2013.01)

(58) Field of Classification Search
None
See application file for complete search history.

(56) References Cited

U.S. PATENT DOCUMENTS 3,514,210 A * 5/1970 Jiri .................. G01N 21/05
                                                    422/82
3,520,517 A * 7/1970 Jiri .................. G01N 21/03
                                                    356/246

(Continued)

FOREIGN PATENT DOCUMENTS

| CN | 1708631 | 12/2005 |
| CN | 1825089 | 8/2006 |

(Continued)

OTHER PUBLICATIONS

International Search Report, with English translation, for International Application No. PCT/KR2020/003823, dated Jun. 30, 2020.

(Continued)

*Primary Examiner* — Rufus L Phillips
(74) *Attorney, Agent, or Firm* — KILE PARK REED & HOUTTEMAN PLLC

(57) ABSTRACT

A flow cell device of the present invention comprises a flow path part in which a flow medium flows, and a flow cell part in which a flow path is formed.

6 Claims, 9 Drawing Sheets

(51) Int. Cl.
*G01N 21/31* (2006.01)
*H01L 21/67* (2006.01)

(56) References Cited

U.S. PATENT DOCUMENTS

| | | | | |
|---|---|---|---|---|
| 3,524,709 | A * | 8/1970 | Jiri | G01N 21/03 |
| | | | | 356/246 |
| 5,030,843 | A * | 7/1991 | Wakamura | G01N 15/0205 |
| | | | | 356/339 |
| 5,242,586 | A * | 9/1993 | Ransohoff | B01D 15/08 |
| | | | | 73/61.52 |
| 8,817,259 | B2 * | 8/2014 | Schick | G01N 21/51 |
| | | | | 356/442 |
| 2006/0182664 | A1 * | 8/2006 | Peck | B82Y 30/00 |
| | | | | 422/400 |
| 2008/0304048 | A1 * | 12/2008 | Tormod | G01N 21/33 |
| | | | | 356/442 |
| 2008/0317627 | A1 * | 12/2008 | Shirai | B01L 3/50273 |
| | | | | 422/52 |
| 2009/0139311 | A1 * | 6/2009 | Lehto | B01L 3/502 |
| | | | | 73/864.91 |
| 2010/0238446 | A1 * | 9/2010 | Akiyama | G01N 21/05 |
| | | | | 356/246 |
| 2012/0242993 | A1 | 9/2012 | Schick et al. | |
| 2019/0376938 | A1 * | 12/2019 | Harrison | G01N 33/0027 |

FOREIGN PATENT DOCUMENTS

| | | |
|---|---|---|
| CN | 102102570 | 6/2011 |
| CN | 202994641 | 6/2013 |
| CN | 104103546 | 10/2014 |
| CN | 104865393 | 8/2015 |
| CN | 205235481 | 5/2016 |
| CN | 107339522 | 11/2017 |
| CN | 107532992 | 1/2018 |
| CN | 206906244 | 1/2018 |
| CN | 208651968 | 3/2019 |
| GB | 1150548 | 4/1969 |
| KR | 10-0196198 | 6/1999 |
| KR | 10-2012-0096832 | 8/2012 |
| KR | 10-1785859 | 10/2017 |
| KR | 10-2018-0027331 | 3/2018 |
| KR | 20180027331 A * | 3/2018 |
| WO | 2007-062800 | 6/2007 |
| WO | 2018-123771 | 7/2018 |

OTHER PUBLICATIONS

Written Opinion for International Application No. PCT/KR2020/003823, dated Jun. 30, 2020.

* cited by examiner

FLOW CELL DEVICE

CROSS-REFERENCE TO RELATED APPLICATION(S)

This application is a national entry of International Application No. PCT/KR2020/003823, filed on Mar. 20, 2020, which claims under 35 U.S.C. § 119(a) and 365(b) priority to and benefits of Korean Patent Application No. 10-2019-0055828, filed on May 13, 2019 in the Korean Intellectual Property Office, the entire contents of which are incorporated herein by reference.

TECHNICAL FIELD

The present invention relates to a flow cell device, and more particularly, to a flow cell device capable of accurately monitoring a state of a fluid medium under usage conditions of the fluid medium.

BACKGROUND ART

Generally, etching processes are performed in a semiconductor manufacturing process such as a semiconductor wafer manufacturing process, a solar cell manufacturing process, or the like. In the etching process, a high-temperature etching solution (a fluid medium) such as a phosphoric acid solution is used for etching a silicon nitride film. In the semiconductor wafer manufacturing process, since an eluate, such as silicon is dissolved and contained in an etching solution, a concentration of the eluate in the etching solution increases as an etching process of the semiconductor wafer proceeds. When the concentration of the eluate in the etching solution is increased by a certain concentration or higher, the etching solution is replaced.

Since it is difficult to perform microanalysis on a concentration of silicon in an etching solution at a high temperature, some of the etching solution is collected and cooled to room temperature. In order to increase detection sensitivity of the cooled etching solution, a concentration of the etching solution is detected after performing chemical treatment on the etching solution multiple times.

However, in the related art, since an etching solution is cooled to room temperature and then chemical treatment is performed on the etching solution multiple times, a range of detection errors is increased according to a temperature difference of the etching solution. Therefore, it is difficult to accurately predict a state of the etching solution under usage conditions applied in an actual semiconductor process.

Further, since the eluate is easily extracted from the etching solution when the high-temperature etching solution is lowered to room temperature, it may be difficult to accurately measure the concentration of the eluate in the etching solution.

Further, since chemical treatment is performed on the etching solution multiple times in order to accurately measure the concentration of the etching solution, a matrix is complicated during concentration analysis such that accuracy of the analyzed concentration is lowered.

The background art of the present invention is disclosed in Korean Patent Registration No. 1785859 (Registered on Sep. 29, 2017, Title of the present invention: "FLUORESCENT SILICON NANOPARTICLE FOR DETECTING COPPER ION, METHOD FOR PREPARING THE SAME, AND ION DETECTING SENSOR USING THE SAME").

DISCLOSURE

Technical Problem

The present invention is directed to providing a flow cell device capable of accurately monitoring a state of a fluid medium under usage conditions of the fluid medium.

Technical Solution

One aspect of the present invention provides a flow cell device including a flow path through which a fluid medium flows and a flow cell part in which the flow path is formed.

The flow cell part may include a flow cell body part in which the flow path is formed, a supply pipe part connected to one side of the flow cell body part so that the fluid medium is supplied to the flow cell body part, and a discharge pipe part connected to the other side of the flow cell body part so that the fluid medium is discharged from the flow cell body part.

The supply pipe part may be connected to a lower side of the flow cell body part and the discharge pipe part may be connected to an upper side of the flow cell body part.

A cross-section area of the flow cell body part may be greater than a cross-section area of the supply pipe part so that the fluid medium forms a turbulent flow in the flow cell body part.

The supply pipe part may include a first supply pipe part through which the fluid medium is supplied, a second supply pipe part formed to have a diameter greater than a diameter of the first supply pipe part so that the fluid medium supplied through the first supply pipe part forms a turbulent flow, and a third supply pipe part extending from the second supply pipe part and connected to the one side of the flow cell body part.

The present invention may further include a first optical part installed to apply light applied from a light source part onto the fluid medium in the flow cell part, and a second optical part installed to apply light, by which a wavelength of the fluid medium is absorbed while passing through the fluid medium in the flow path, to a photodetector part.

The first optical part may be disposed on the one side of the flow cell body part to apply the light in a parallel manner with a flow direction of the fluid medium.

The first optical part may include a first optical slider part disposed on the one side of the flow cell body part, a first reflective mirror disposed on the first optical slider part to apply light incident from the light source part onto the fluid medium in the flow cell body part, and a first adjusting unit installed on the first optical slider part to adjust a position of the first reflective mirror.

The second optical part may include a second optical slider part disposed on the other side of the flow cell body part, a second reflective mirror disposed on the second optical slider part to apply the light absorbing the wavelength of the fluid medium in the flow cell body part to the photodetector part, and a second adjusting unit installed on the second optical slider part to adjust a position of the second reflective mirror.

The flow cell device may further include an elastic pressing part installed in a housing part to elastically support an outer side surface of the flow cell part.

A separation space may be formed inside the housing part to allow an expansion space of the flow cell part.

The flow cell device may further include a first collimator part which faces the first optical part and to which a first optical fiber part is connected, and a second collimator part which faces the second optical part and to which a second optical fiber part is connected.

The flow cell device may further include a bubble removal unit which is connected to a fluid medium inlet side of the flow cell part and removes bubbles mixed in the fluid medium introduced into the flow cell part.

The bubble removal unit may include a bubble discharge line connected to the fluid medium inlet side of the flow cell part, and a bubble discharge valve installed on the bubble discharge line.

One side of the bubble discharge line may be connected to a circulation pump installed in a circulation flow path.

The bubble removal unit may further include a medium discharge valve installed on the bubble discharge line to discharge the fluid medium accommodated in the flow cell part.

Advantageous Effects

According to the present invention, since a high-temperature fluid medium flows through a flow cell part and a wavelength of the fluid medium is absorbed by light, it is not necessary to chemically treat the fluid medium multiple times in order to measure a concentration of the fluid medium under conditions in which the fluid medium is used in an actual semiconductor process and to increase detection sensitivity of the fluid medium.

Further, according to the present invention, since an elastic pressing part elastically supports an outer side surface of a flow cell part, the elastic pressing part can stably support the flow cell part even when the flow cell part expands or contracts due to a temperature of the fluid medium. Therefore, when the flow cell part expands or contracts, it is possible to prevent the flow cell part from being pressed against and damaged by a housing part.

MODES OF THE INVENTION

Figure 1:
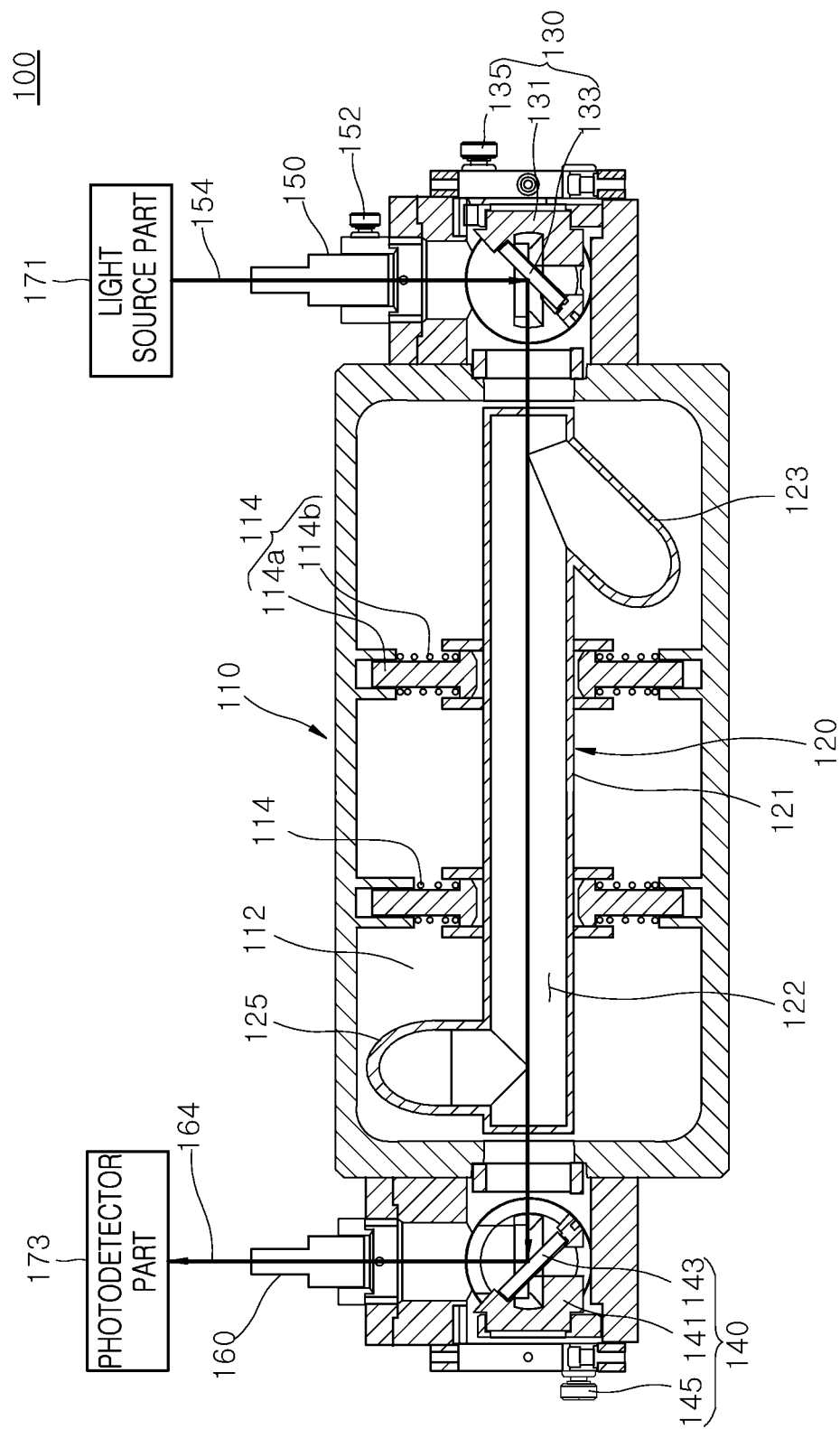
FIG. 1 is a cross-sectional view illustrating a flow cell device according to an embodiment of the present invention.

Hereinafter, embodiments of a flow cell device according to the present invention will be described with reference to the accompanying drawings. In a process of describing the flow cell device, thicknesses of lines, sizes of components, and the like illustrated in the drawings may be exaggerated for clarity and convenience of description. Further, some terms which will be described below are defined in consideration of functions in the present invention and meanings may vary depending on, for example, a user or operator's intentions or customs. Therefore, the meanings of these terms should be interpreted based on the scope throughout this specification.

Figure 2:
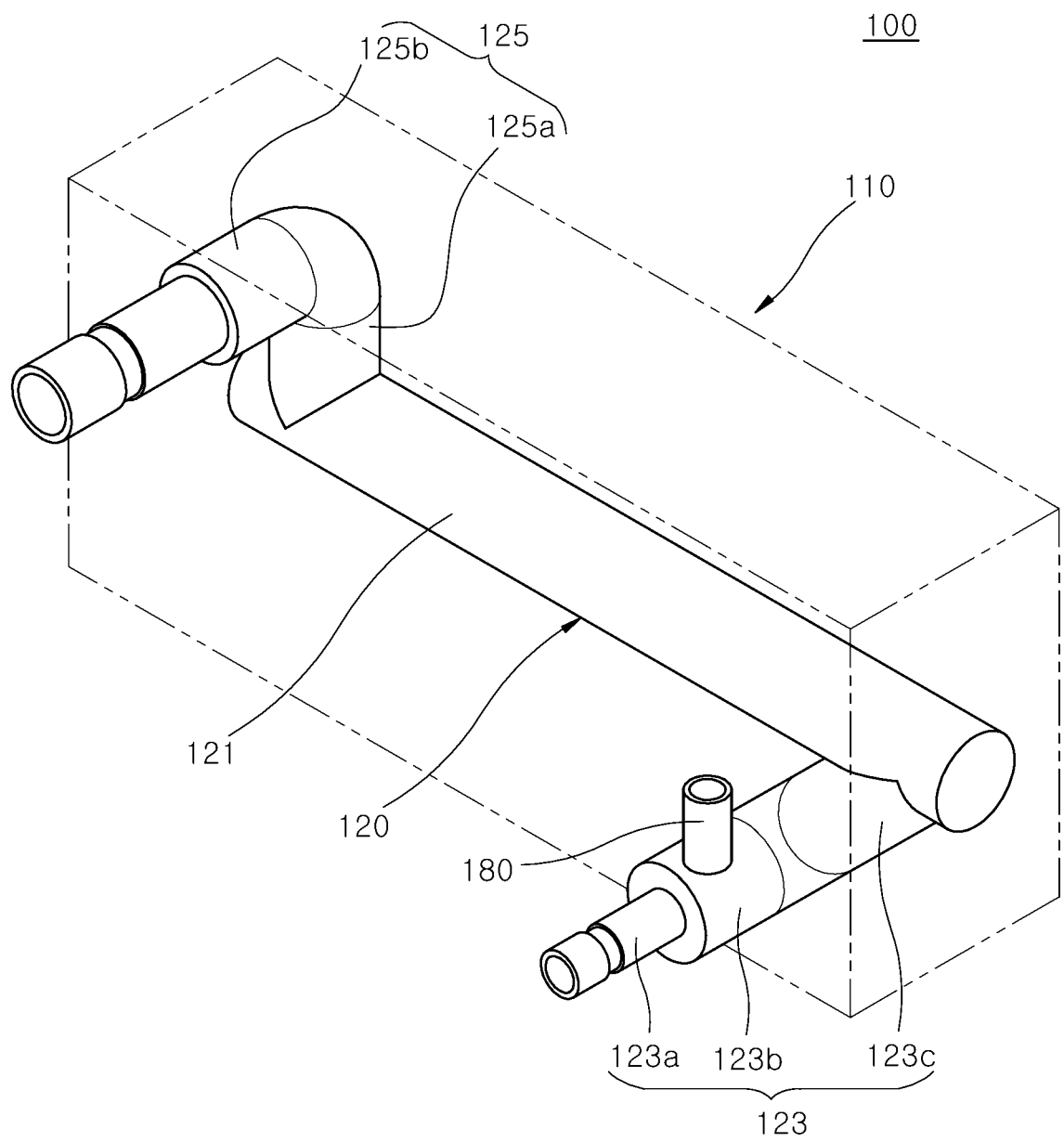
FIG. 2 is a perspective view illustrating a flow cell part in the flow cell device according to the embodiment of the present invention.
Figure 3:
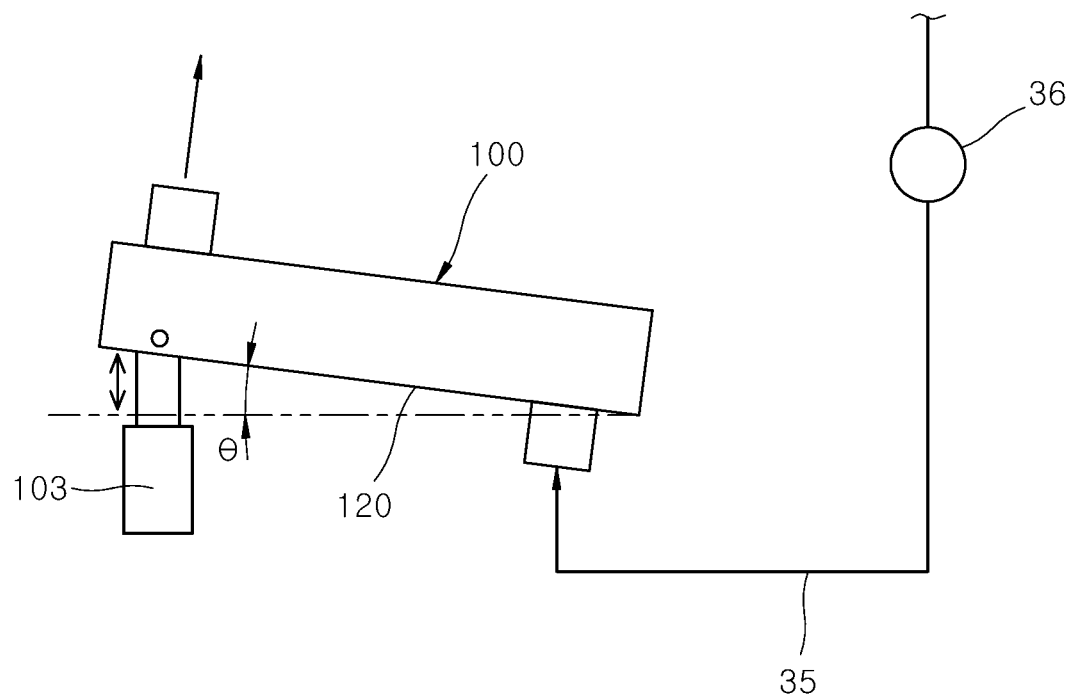
FIG. 3 is a schematic view illustrating a state in which the flow cell device is installed to be inclined according to the embodiment of the present invention.

FIG. 1 is a cross-sectional view illustrating a flow cell device according to an embodiment of the present invention, FIG. 2 is a perspective view illustrating a flow cell part in the flow cell device according to the embodiment of the present invention, and FIG. 3 is a schematic view illustrating a state in which the flow cell device is installed to be inclined according to the embodiment of the present invention.

Referring to FIGS. 1 to 3, a flow cell device 100 according to the embodiment of the present invention includes a housing part 110, a flow cell part 120, a first optical part 130, and a second optical part 140.

The housing part 110 is formed to extend in a longitudinal direction thereof. The housing part 110 may be formed in the form of a rectangular box. The housing part 110 may be formed of a heat-resistant material to prevent thermal deformation at high temperature.

The flow cell part 120 is accommodated in the housing part 110 and a flow path 122 is formed so that a fluid medium flows therethrough. A cross section of the flow path 122 has a circular shape to reduce resistance of the fluid medium. The fluid medium may be an etching solution which is used in a semiconductor process when a semiconductor wafer, a solar cell, or the like is manufactured. The etching solution may include a phosphoric acid solution of 150 to 200° C. The flow cell part 120 may be formed of any one of a quartz material, a Pyrex glass, a Teflon material, a sapphire material, etc. to prevent thermal deformation and corrosion due to the fluid medium of about 150 to 200° C.

Since the fluid medium heated to 150 to 200° C. flows through the flow cell part 120 to suppress extraction of materials contained in the fluid medium, a high-temperature fluid medium may flow through the flow cell part 120 so that a wavelength of the high-temperature fluid medium is absorbed by light.

Therefore, in order to measure a concentration of the fluid medium under conditions in which the fluid medium is used in an actual semiconductor process and to increase detection sensitivity of the fluid medium, it is not necessary to chemically treat the fluid medium multiple times. Further, since it is not necessary to cool the fluid medium to room temperature, detection errors may be prevented from occurring due to a temperature difference of the fluid medium and a state of the fluid medium may be accurately predicted under usage conditions applied in the actual semiconductor process. Further, a matrix may be simplified during concentration analysis so that accuracy of the analyzed concentration may be improved.

The first optical part 130 is disposed on the housing part 110 to apply light applied from a light source part 171 in a parallel manner with a flow direction of the fluid medium in the flow cell part 120. In this case, since the light proceeds in the flow cell part 120 in a moving direction of the fluid medium, scattering or refraction of the light due to bubbles or eluates when the light passes through the fluid medium may be minimized so that light loss may be reduced. Further, wavelengths of eluates contained in the fluid medium may be smoothly absorbed by the light while the light passes through the fluid medium, and thus light detection efficiency may be improved.

The second optical part 140 is disposed on the housing part 110 to apply the light by which the wavelength of the fluid medium is absorbed while passing through the fluid medium in the flow path 122 to a photodetector part 173.

The flow cell part 120 includes a flow cell body part 121, a supply pipe part 123, and a discharge pipe part 125.

The flow cell body part 121 is accommodated in the housing part 110 and a flow path 122 is formed in the flow cell body part 121. A cross section of the flow cell body part 121 has a circular shape. Since the cross section of the flow cell body part 121 has the circular shape, flow resistance of the fluid medium flowing through the flow path 122 may be reduced.

The supply pipe part 123 is connected to one side of the flow cell body part 121 to supply the fluid medium to the flow cell body part 121. A cross section of the supply pipe part 123 has a circular shape to reduce the flow resistance of the fluid medium.

The discharge pipe part 125 is connected to the other side of the flow cell body part 121 to discharge the fluid medium in the flow cell body part 121. A cross section of the discharge pipe part 125 has a circular shape to reduce the flow resistance of the fluid medium.

Since the supply pipe part 123 is connected to one side of the flow cell body part 121 and the discharge pipe part 125 is connected to the other side of the flow cell body part 121, the fluid medium flows from one side of the flow cell body part 121 to the other side of the flow cell body part 121.

The supply pipe part 123 is connected to a lower side of the flow cell body part 121 and the discharge pipe part 125 is connected to an upper side of the flow cell body part 121. In this case, a specific gravity of the bubbles contained in the fluid medium is less than a specific gravity of the fluid medium.

A cross-section area of the flow cell body part 121 may be greater than a cross-section area of the supply pipe part 123 so that the fluid medium forms a turbulent flow in the flow cell body part 121. Therefore, since the cross-section area of the flow cell body part 121 is rapidly increased compared to the cross-section area of the supply pipe part 123, some of the fluid medium may be prevented from stagnating in the flow cell part 120 due to the turbulent flow when the fluid medium of the supply pipe part 123 is introduced into the flow cell body part 121. Therefore, the concentration of the fluid medium while the light passes through the fluid medium may be accurately measured.

Since the supply pipe part is connected to a lower portion of the flow cell part 120 and the discharge pipe part 125 is connected to an upper portion of the flow cell part 120, the fluid medium flows from a lower side to an upper side of the flow cell part 120. Further, since most of the bubbles contained in the fluid medium flow across a diameter of the flow cell part 120 and then flow along the upper side of the flow cell part 120, scattering or refraction of the light due to the bubbles when the light flows through an inside of the flow cell part 120 may be minimized so that occurrence of light loss may be minimized.

The supply pipe part 123 includes a first supply pipe part 123a, a second supply pipe part 123b, and a third supply pipe part 123c.

The fluid medium is supplied to the first supply pipe part 123a. The first supply pipe part 123a is disposed to be spaced a predetermined interval from one side toward a central portion of the flow cell body part 121.

The second supply pipe part 123b is formed to have a diameter wider than a diameter of the first supply pipe part 123a so that the fluid medium supplied from the first supply pipe part 123a forms a turbulent flow. Since the diameter of the second supply pipe part 123b is wider than the diameter of the first supply pipe part 123a, the fluid medium is diffused and a flow velocity is increased when the fluid medium of the first supply pipe part 123a is introduced into the second supply pipe part 123b. Therefore, in the second supply pipe part 123b, the fluid medium forms the turbulent flow and thus some of the fluid medium may be suppressed from stagnating in the flow cell part 120.

The third supply pipe part 123c extends from the second supply pipe part 123b and is connected to one side of the flow cell body part 121 so as to be inclined with respect to a longitudinal direction of the flow cell body part 121. In this case, the third supply pipe part 123c is formed to be inclined downward from one side of the flow cell body part 121 toward the other side of the flow cell body part 121. Since the third supply pipe part 123c is connected to the flow cell body part 121 so as to be inclined with respect to the longitudinal direction of the flow cell body part 121, the bubbles contained in the fluid medium flow through an upper side of the third supply pipe part 123c and then flow through an upper side of the flow cell body part 121. Therefore, it is possible to minimize scattering or refraction of the light due to the bubbles contained in the fluid medium.

The discharge pipe part 125 includes a first discharge pipe part 125a which extends to be perpendicular to the upper side of the flow cell body part 121, and a second discharge pipe part 125b which extends from the first discharge pipe part 125a to be perpendicular to the longitudinal direction of the flow cell body part 121. A diameter of the first discharge pipe part 125a is the same as or substantially the same as the diameter of the flow cell body part 121. Since the first discharge pipe part 125a extends to be perpendicular to the upper side of the flow cell body part 121, it is possible to minimize the fluid medium discharged from the flow cell body part 121 flowing backward to a lower side of the first discharge pipe part 125a due to a pressure difference.

The first optical part 130 is disposed on one side of the flow cell body part 121 to apply the light in a parallel manner with the flow direction of the fluid medium. Since the light proceeds in the flow cell body part 121 in the moving direction of the fluid medium, scattering or refraction of the light due to the bubbles or the eluates when the light passes through the fluid medium may be minimized so that light loss may be reduced. Further, the wavelengths of the eluates contained in the fluid medium may be smoothly absorbed by the light while the light passes through the fluid medium, and thus light detection efficiency may be improved.

The first optical part 130, the flow cell body part 121, and the second optical part 140 are disposed to be collinear. Therefore, the light applied from the first optical part 130 may straightly proceed through the flow cell body part 121 and the second optical part 140.

The first optical part 130 includes a first optical slider part 131, a first reflective mirror 133, and a first adjusting unit 135.

The first optical slider part 131 is disposed on one side of the flow cell body part 121. The first optical slider part 131 is movably installed. The first reflective mirror 133 is disposed on the first optical slider part 131 to apply the light incident from the light source part 171 onto the fluid medium in the flow cell body part 121. The first reflective mirror 133 is disposed to be inclined by approximately 45°. The first adjusting unit 135 is installed on the first optical slider part 131 to adjust a position of the first reflective mirror 133. The first adjusting unit 135 may be formed in the form of a screw. The first optical slider part 131 and the first reflective mirror 133 are moved by rotating the first adjusting unit 135.

The second optical part 140 includes a second optical slider part 141, a second reflective mirror 143, and a second adjusting unit 145. The second optical slider part 141 is disposed on the other side of the flow cell body part 121. The second optical slider part 141 is movably installed. The second reflective mirror 143 is disposed on the second optical slider part 141 to apply the light incident from the light source part 171 onto the photodetector part 173. The second reflective mirror 143 is disposed to be inclined by approximately 45°. The second adjusting unit 145 is installed on the second optical slider part 141 to adjust a position of the second reflective mirror 143. The second adjusting unit 145 may be formed in the form of a screw. The second optical slider part 141 and the second reflective mirror 143 are moved by rotating the second adjusting unit 145.

The flow cell device 100 further includes an elastic pressing part 114 which is installed in the housing part 110 to elastically support an outer side surface of the flow cell part 120. The elastic pressing part 114 includes a pressing rod part 114a which supports the outer side surface of the flow cell part 120 and an elastic member 114b installed to move the pressing rod part 114a toward the flow cell part 120. A plurality of elastic pressing parts 114 are disposed in the longitudinal direction of the flow cell part 120. Since the elastic pressing parts 114 elastically support the outer side surface of the flow cell part 120, the elastic pressing parts 114 stably support the flow cell part 120 even when the flow cell part 120 expands or contracts due to a temperature of the fluid medium. Therefore, when the flow cell part 120 expands or contracts, the flow cell part 120 may be prevented from being pressed against and damaged by the housing part 110.

A separation space 112 is formed inside the housing part 110 to allow an expansion space of the flow cell part 120. Therefore, even when the flow cell part 120 expands or contracts due to the fluid medium, the flow cell part 120 may be prevented from being pressed against and damaged by the housing part 110.

The flow cell device 100 further includes a first collimator part 150 which faces the first optical part 130 and to which a first optical fiber part 154 is connected, and a second collimator part 160 which faces the second optical part 140 and to which a second optical fiber part 164 is connected.

The first collimator part 150 collimates the light applied from the light source part 171 in a parallel manner. Since the first collimator part 150 collimates the light in the parallel manner, the light applied from the first light source part 171 is incident on the flow cell part 120 in the parallel manner. A first adjusting screw part 152 is installed on the first collimator part 150 to adjust a position of the first collimator part 150.

Since the first optical fiber part 154 is connected to the light source part 171 and the first collimator part 150, the light source part 171 may be installed to be spaced apart from the flow cell part 120. A high-temperature fluid medium of about 150 to 200° C. passes through the flow cell part 120 so that the flow cell part 120 is heated by the high-temperature fluid medium. Since the light source part 171 and the photodetector part 173 are installed to be spaced apart from the flow cell part 120 by the first optical fiber part 154 and the second optical fiber part 164, the light source part 171 may be prevented from being overheated due to the heat of the flow cell part 120. Further, in order to cool or thermally insulate the light source part 171, it is not necessary to install a separate cooling device or thermal insulating member.

The second collimator part 160 collects the parallel light applied from the flow cell body part 121 to the photodetector part 173. Since the parallel light is collected while passing through the second collimator part 160, detection efficiency in the photodetector part 173 may be improved. A second adjusting screw part 162 is installed on the second collimator part 160 to adjust a position of the second collimator part 160.

Since the second optical fiber part 164 is connected to the photodetector part 173 and the second collimator part 160, the photodetector part 173 may be installed to be spaced apart from the flow cell part 120. The high-temperature fluid medium of about 150 to 200° C. passes through the flow cell part 120 so that the flow cell part 120 is heated by the high-temperature fluid medium. Since the photodetector part 173 is installed to be spaced apart from the flow cell part 120 by the second optical fiber part 164, the photodetector part 173 may be prevented from being overheated due to the heat of the flow cell part 120. Further, in order to cool or thermally insulate the photodetector part 173, it is not necessary to install a separate cooling device or thermal insulating member.

Since the first optical fiber part 154 and the second optical fiber part 164 are installed on both sides of the flow cell part 120, the flow cell part 120, the light source part 171, and the photodetector part 173 do not need to be arranged in a line. Therefore, a degree of freedom of installation of the flow cell device 100 may be increased.

Further, in the flow cell device 100, the flow cell part 120 may be disposed to be inclined upward from the supply pipe part 123 (one side) to the discharge pipe part 125 (the other side). Since the flow cell part 120 is disposed to be inclined upward to the discharge side of the fluid medium, the bubbles contained in the fluid medium flow through the upper side of the flow cell part 120. Therefore, it is possible to minimize occurrence of light loss due to the bubbles when the light flows through the inside of the flow cell part 120.

Figure 4:
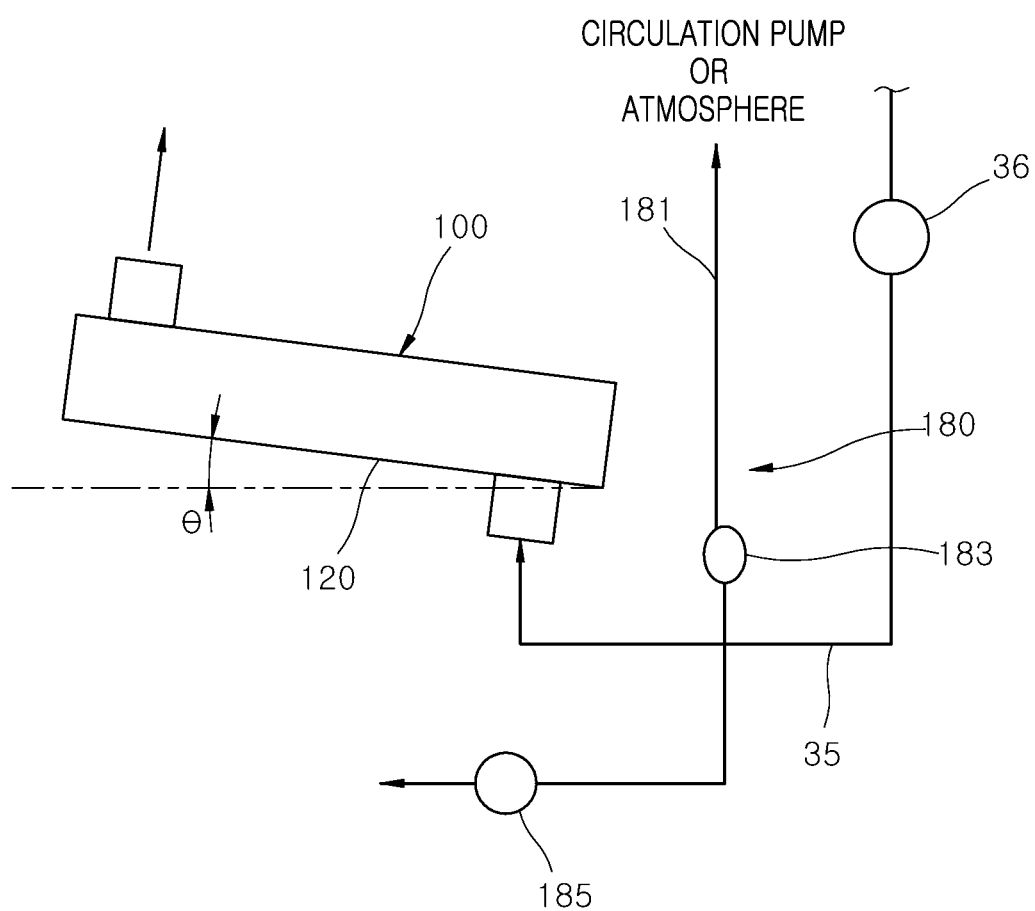
FIG. 4 is a schematic view illustrating a state in which a bubble removal unit is installed in the flow cell device according to the embodiment of the present invention.

Referring to FIG. 4, the flow cell device 100 further includes a bubble removal unit 180 which is connected to a fluid medium inlet side of the flow cell part 120 to remove bubbles mixed in the fluid medium introduced into the flow cell part 120. Since the bubbles mixed in the fluid medium are removed by the bubble removal unit 180 and the fluid medium, from which the bubbles are removed, is introduced into the flow cell part 120, the light applied to the fluid medium may be prevented from being scattered or refracted due to the bubbles so that occurrence of light loss may be suppressed. Therefore, measurement accuracy of the concentration of the fluid medium may be improved.

The bubble removal unit 180 includes a bubble discharge line 181 connected to the inlet side of the fluid medium in the flow cell part 120 and a bubble discharge valve 183 installed on the bubble discharge line 181. When the bubble discharge valve 183 is opened, the bubbles may be discharged through the bubble discharge line 181.

In this case, a degree of opening of the bubble discharge valve 183 may be adjusted to adjust an exhaust pressure of the bubble discharge line 181. The degree of opening of the bubble discharge valve 183 may be adjusted according to a pumping pressure of a circulation pump 41. Therefore, it is possible to adjust an amount of the bubbles discharged from the bubble discharge line 181 and to prevent the fluid medium from being discharged through the bubble discharge line 181.

One side of the bubble discharge line 181 may be connected to the circulation pump 41 installed on a circulation flow path 30. Therefore, the bubbles of the bubble discharge line 181 may be discharged to the circulation flow path 30 due to a suction pressure of the circulation pump 41.

One side of the bubble discharge line 181 may be installed to be exposed to an atmosphere. In this case, since the bubbles of the bubble discharge line 181 are not introduced into the circulation flow path 30, the fluid medium, from which the bubbles are removed, is supplied to an inner tank 20. Therefore, the bubbles mixed in the fluid medium may be prevented from adhering to a wafer, and thus processing precision of the wafer may be improved and a defect rate may be reduced.

The bubble removal unit 180 may further include a medium discharge valve 185 which is installed on the bubble discharge line 181 to discharge the fluid medium accommodated in the flow cell part 120. The other side of the bubble discharge line 181 may be connected to a drain bath (not illustrated). When the flow cell part 120 is cleaned after the wafer processing is stopped, the medium discharge valve 185 may be opened to discharge the fluid medium accommodated in the flow cell part 120.

A first example of an etching device to which the flow cell device described above is applied will be described.

Figure 5:
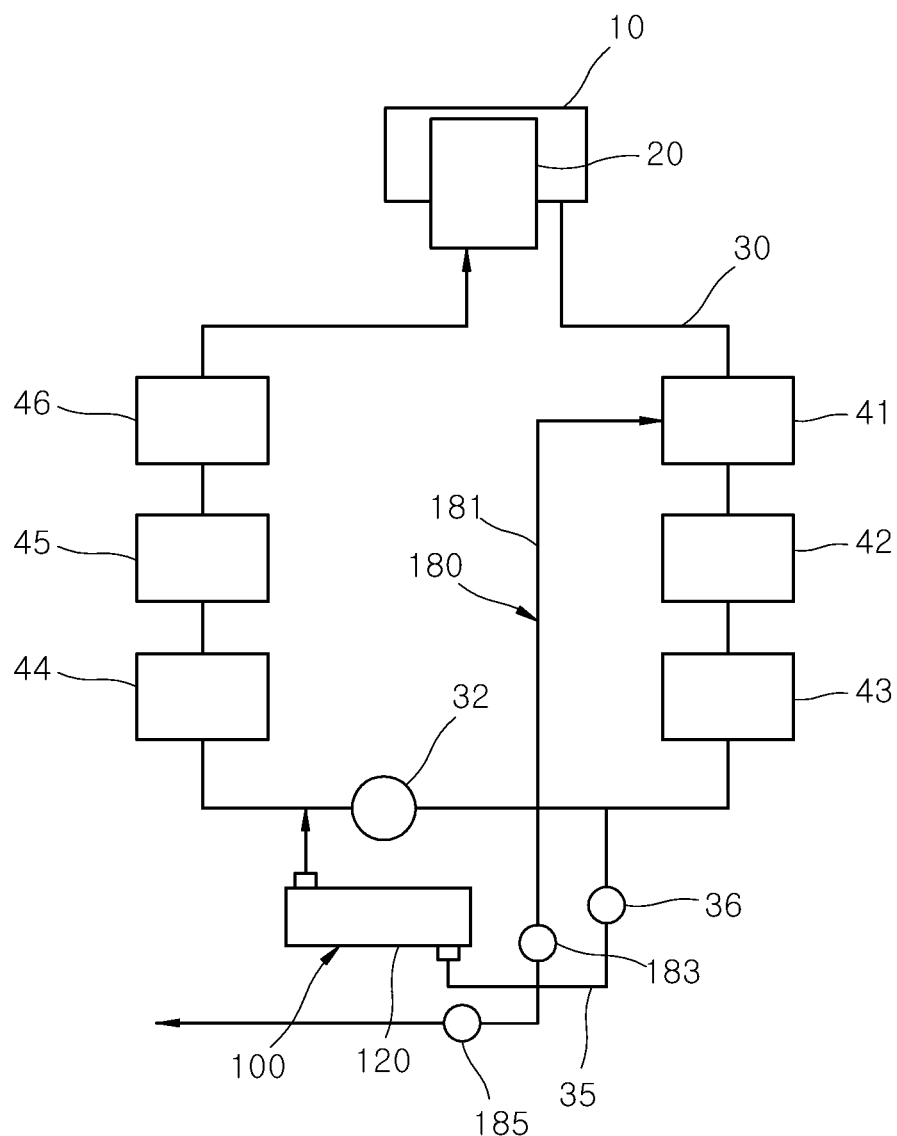
FIG. 5 is a block diagram illustrating a first example of an etching device to which the flow cell device is applied according to the embodiment of the present invention.

FIG. 5 is a block diagram illustrating a first example of an etching device to which the flow cell device is applied according to the embodiment of the present invention.

Referring to FIG. 5, the etching device includes an outer tank 10 and an inner tank 20. The inner tank 20 and the outer tank 10 are connected to a circulation flow path 30. In the circulation flow path 30, a circulation pump 41, a damper 42, a filter part 43, a main valve 32, a heater part 44, a bubble cutter 45, and a concentration measuring part 46 are sequentially installed.

The outer tank 10 overflows with a fluid medium accommodated in the inner tank 20. The fluid medium of the outer tank 10 flows to the damper 42 due to the circulation pump 41, and the filter part 43 filters the fluid medium introduced thereinto. The fluid medium filtered by the filter part 43 flows to the heater part 44 through the main valve 32 and is heated by the heater part 44. Bubbles in the fluid medium heated by the heater part 44 are removed by the bubble cutter 45 and the concentration measuring part 46 measures a concentration of a phosphoric acid solution.

A bypass flow path 35 is connected to the circulation flow path 30. The bypass flow path 35 may connect a discharge side of the outer tank 10 to an inlet side of the pump 41, connect a discharge side of the damper 42 to an inlet side of the filter part 43, or connect a discharge side of the filter part 43 to an inlet side of the heater part 44. A high-temperature fluid medium flowing through the circulation flow path 30 is supplied to a flow cell device 100 through the bypass flow path 35. In the flow cell device 100, after the concentration of the fluid medium is measured, the fluid medium returns in the circulation flow path 30.

In this case, when a bubble removal unit 180 is installed on an inlet side of the flow cell device 100 in the bypass flow path 35, the bubbles mixed in the fluid medium are removed by the bubble removal unit 180 in the inlet side of the flow cell device 100. Since the fluid medium, from which the bubbles are removed, is introduced into the flow cell device 100, light may be prevented from being scattered or refracted due to the bubbles when measuring a concentration of the fluid medium and thus measurement accuracy of the concentration of the fluid medium may be improved.

Further, the fluid medium heated at 150 to 200° C. flows through the flow cell device 100 to suppress extraction of the materials contained in the fluid medium. Further, a high-temperature fluid medium may flow through the flow cell device 100 so that a wavelength of the heated fluid medium is absorbed by the light.

Therefore, in order to measure a concentration of the fluid medium under conditions in which the fluid medium is used in an actual semiconductor process and to increase detection sensitivity of the fluid medium, it is not necessary to chemically treat the fluid medium multiple times. Further, since it is not necessary to cool the fluid medium to room temperature, detection errors may be prevented from occurring due to a temperature difference of the fluid medium, and a state of the fluid medium may be accurately predicted under usage conditions applied in the actual semiconductor process. Further, a matrix may be simplified during concentration analysis so that accuracy of the analyzed concentration may be improved.

Further, in the flow cell device 100, the flow cell part 120 may be disposed to be inclined upward from the supply pipe part 123 (one side) to the discharge pipe part 125 (the other side). Since the flow cell part 120 is disposed to be inclined upward to a discharge side of the fluid medium, the bubbles contained in the fluid medium flow through the upper side of the flow cell part 120. Therefore, it is possible to minimize occurrence of light loss due to the bubbles when the light flows through the inside of the flow cell part 120.

Figure 6:
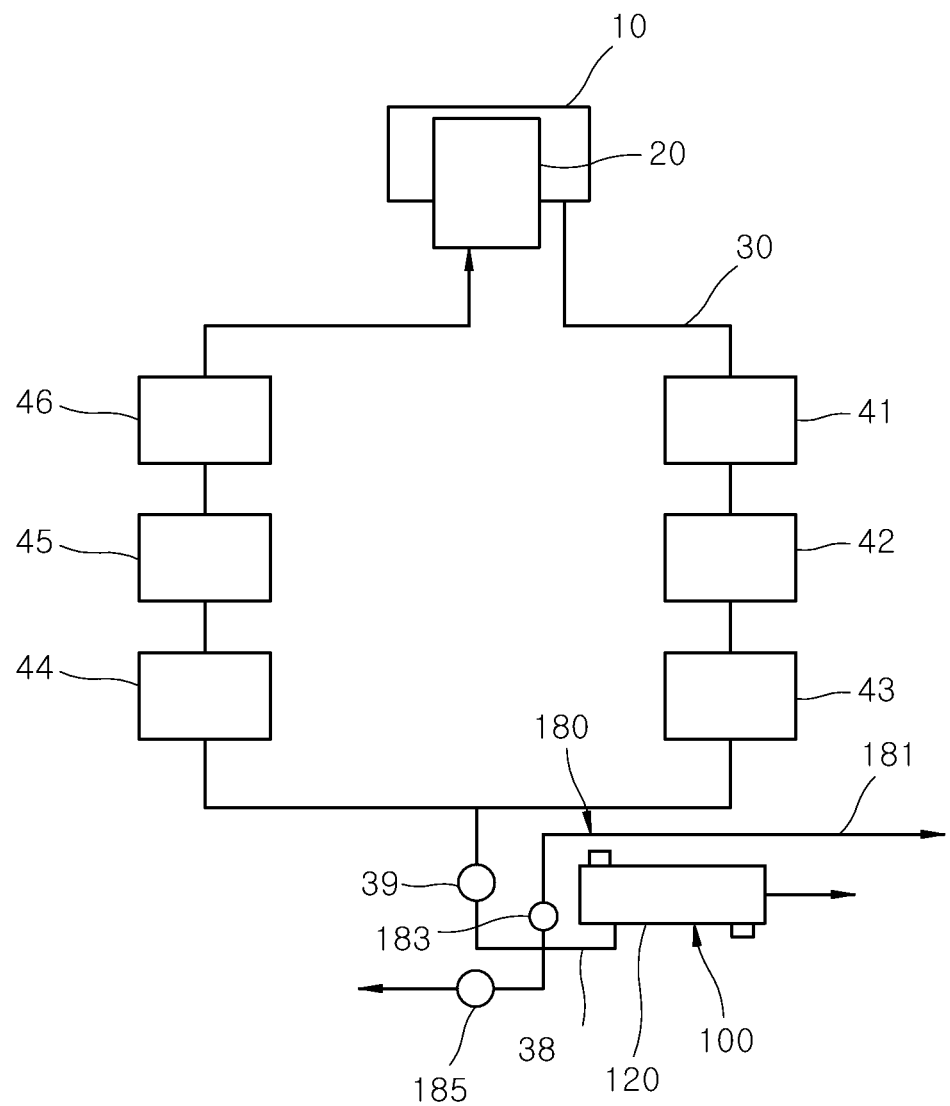
FIG. 6 is a block diagram illustrating a second example of the etching device to which the flow cell device is applied according to the embodiment of the present invention.

FIG. 6 is a block diagram illustrating a second example of the etching device to which the flow cell device is applied according to the embodiment of the present invention.

Referring to FIG. 6, the etching device includes an outer tank 10 and an inner tank 20. The inner tank 20 and the outer tank 10 are connected to a circulation flow path 30. In the circulation flow path 30, a circulation pump 41, a damper 42, a filter part 43, a main valve 32, a heater part 44, a bubble cutter 45, and a concentration measuring part 46 are sequentially installed.

A drain pipe 38 is connected to the circulation flow path 30. A drain valve 39 and a flow cell device 100 are installed on the drain pipe 38. When the drain valve 39 is opened, a fluid medium is introduced into the flow cell device 100 and a concentration of the fluid medium is measured in the flow cell device 100. The fluid medium discharged to the flow cell device 100 is discharged to the outside of the etching device through the drain pipe 38.

In this case, when a bubble removal unit 180 is installed on an inlet side of the flow cell device 100 in the drain pipe 38, the fluid medium, from which the bubbles are removed, is introduced into the flow cell device 100. Light may be prevented from being scattered or refracted due to the bubbles when measuring a concentration of the fluid medium and thus measurement accuracy of the concentration of the fluid medium may be improved.

Figure 7:
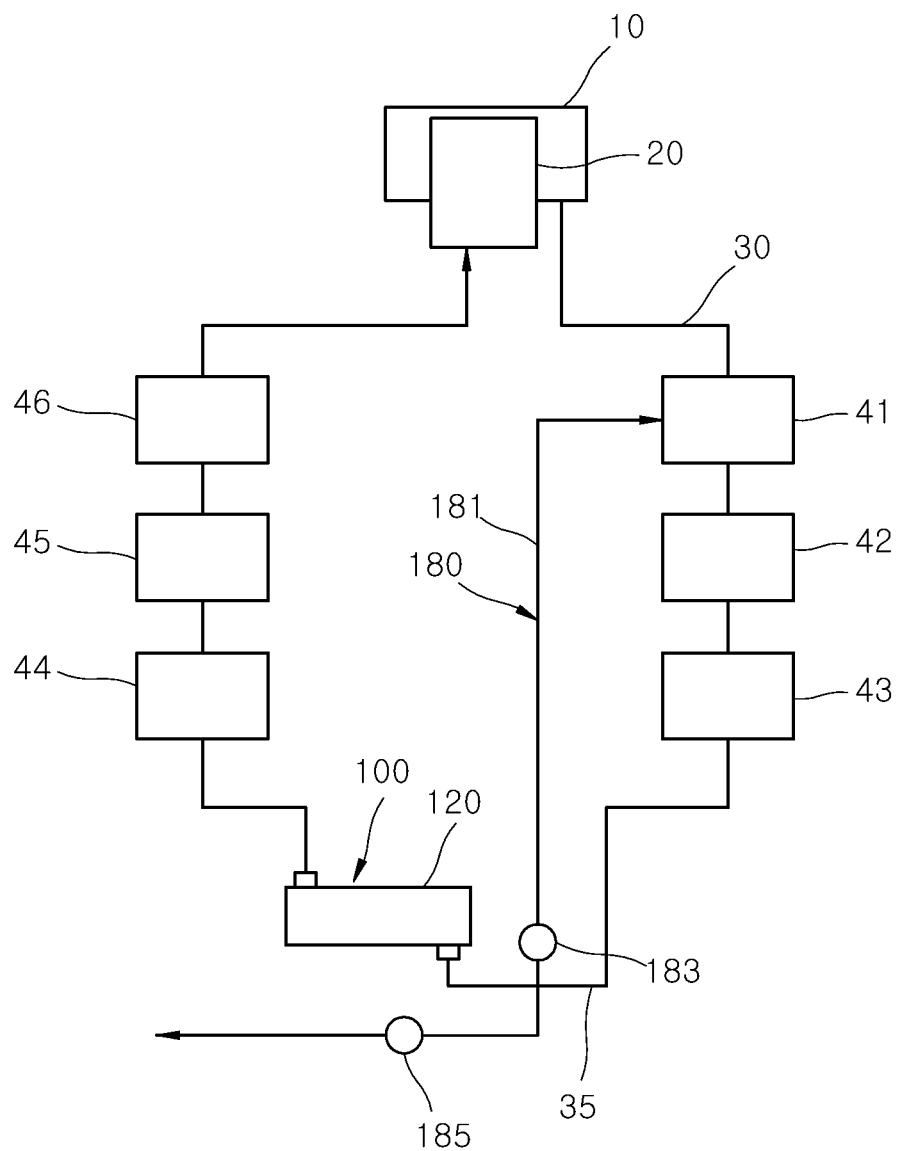
FIG. 7 is a block diagram illustrating a third example of the etching device to which the flow cell device is applied according to the embodiment of the present invention.

FIG. 7 is a block diagram illustrating a third example of the etching device to which the flow cell device is applied according to the embodiment of the present invention.

Referring to FIG. 7, the etching device includes an outer tank 10 and an inner tank 20. The inner tank 20 and the outer tank 10 are connected to a circulation flow path 30. In the circulation flow path 30, a circulation pump 41, a damper 42, a filter part 43, a main valve 32, a heater part 44, a bubble cutter 45, and a concentration measuring part 46 are sequentially installed.

A flow cell device 100 is directly installed in the circulation flow path 30. In this case, a drain pipe or a bypass pipe is not installed in the circulation flow path.

A fluid medium flowing through the circulation flow path is introduced into the flow cell device 100 and the flow cell device 100 measures a concentration of the fluid medium. The fluid medium discharged from the flow cell device 100 is introduced into the inner tank.

In this case, when a bubble removal unit is installed on an inlet side of the flow cell device in the bypass flow path 35, the bubbles mixed in the fluid medium are removed by the bubble removal unit on an inlet side of the flow cell device 100. Since the fluid medium, from which the bubbles are removed, is introduced into the flow cell device 100, light may be prevented from being scattered or refracted due to the bubbles when measuring the concentration of the fluid medium and thus measurement accuracy of the concentration of the fluid medium may be improved.

Next, a method of determining a replacement timing of a wafer in a flow cell device will be described.

Figure 8:
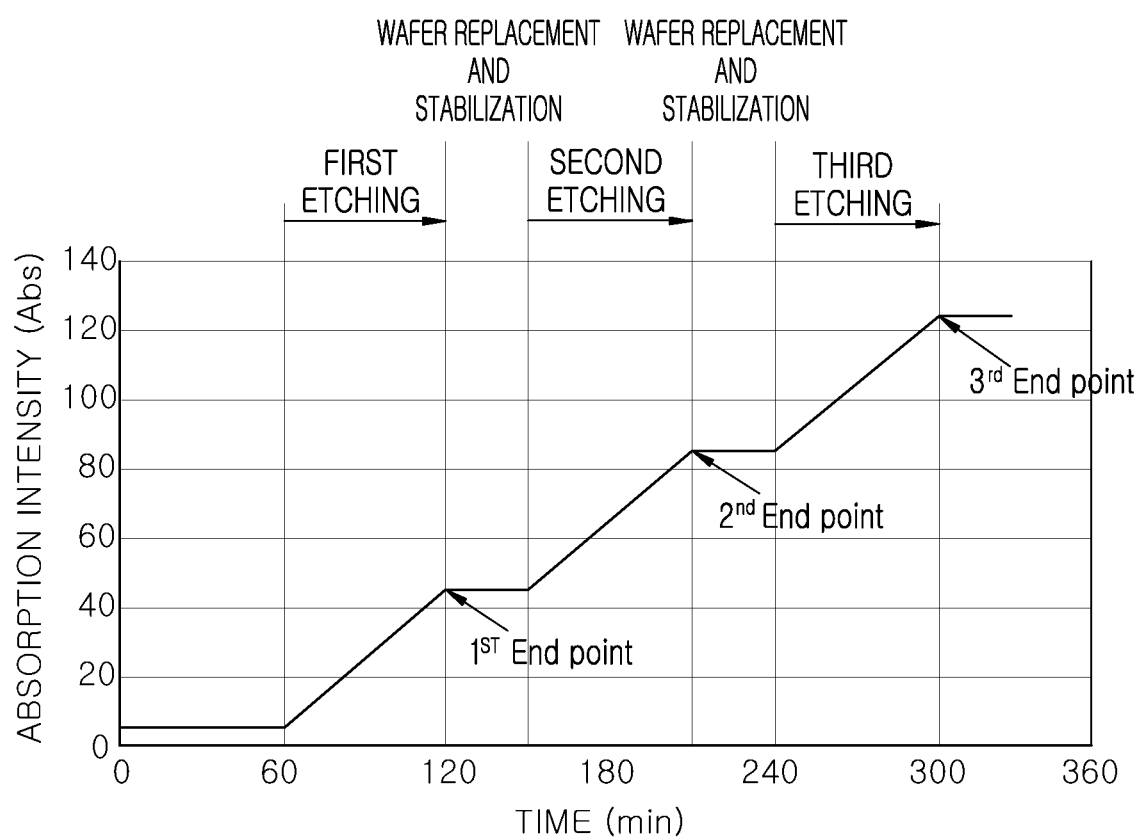
FIG. 8 is a graph showing a first method of measuring a concentration of a fluid medium in the flow cell device according to the embodiment of the present invention.

FIG. 8 is a graph showing a first method of measuring a concentration of a fluid medium in the flow cell device according to the embodiment of the present invention.

Referring to FIG. 8, in the flow cell device, the concentration of the fluid medium is measured. When a wafer is etched, eluates continue to elute from the wafer. When the concentration of the fluid medium when the wafer is first etched in an etching device is continuously measured, a section in which the concentration of the fluid medium increases and then stagnates appears. Such a stagnation section is determined as a first ending point and the wafer is replaced. When the first etching process is completed, a second etching process is performed. When a section in which the concentration of the fluid medium increases and then stagnates appears even in the second etching process, the wafer, on which the second etching process is performed, is replaced. Therefore, since the concentration of the fluid medium is measured under conditions in which the fluid medium is used in an actual semiconductor process, a state of the fluid medium and a replacement timing of the wafer may be accurately determined.

Figure 9:
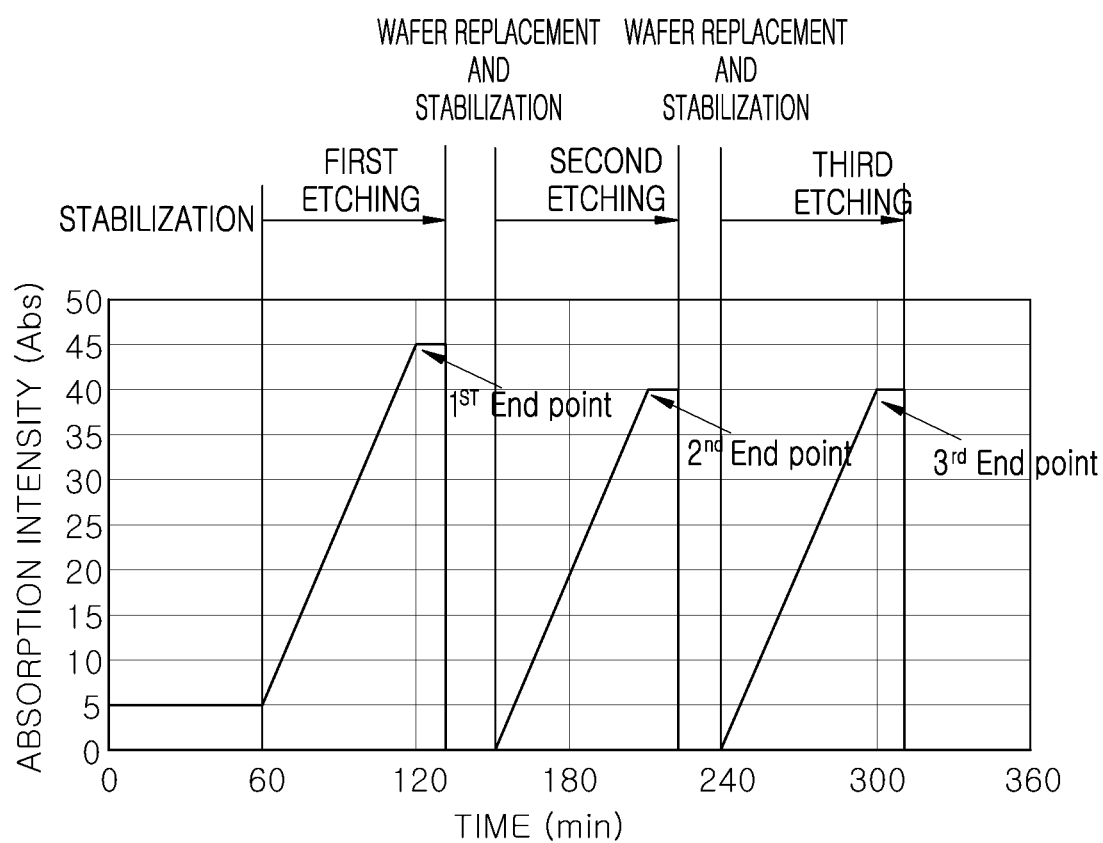
FIG. 9 is a graph showing a second method of measuring the concentration of the fluid medium in the flow cell device according to the embodiment of the present invention.

FIG. 9 is a graph showing a second method of measuring the concentration of the fluid medium in the flow cell device according to the embodiment of the present invention.

Referring to FIG. 9, when the concentration of the fluid medium when the wafer is first etched in the etching device is continuously measured, a section in which the concentration of the fluid medium increases and then stagnates appears. Such a stagnation section is determined as a first ending point and the wafer is replaced. After replacing the wafer, a first ending point value is initialized. Starting from the initialized value, a second etching process is performed. When a section in which the concentration of the fluid medium increases and then stagnates appears even in the second etching process, the wafer, on which the second etching process is performed, is replaced. After the wafer is replaced, a second ending point value is initialized. Through the above processes, a replacement timing of the wafer may be predicted. Therefore, since the concentration of the fluid medium is measured under conditions in which the fluid medium is used in an actual semiconductor process, a state of the fluid medium and the replacement timing of the wafer may be accurately determined.

The present invention has been described with reference to the examples illustrated in the drawings, but these are only examples. It will be understood by those skilled in the art that various modifications and equivalent other examples may be made.

Therefore, the scope of the present invention is defined by the appended claims.

The invention claimed is:

1. A flow cell device comprising:
a flow path through which a fluid medium flows;
a flow cell part in which the flow path is formed; and
a plurality of elastic pressing parts installed in a housing part to elastically support an outer side surface of the flow cell part; the plurality of elastic pressing parts are disposed in a longitudinal direction of the flow cell part; and each elastic pressing part comprises a pressing rod part,
wherein the flow cell part includes:
a flow cell body part in which the flow path is formed;
a supply pipe part connected to one side of the flow cell body part so that the fluid medium is supplied to the flow cell body part; and
a discharge pipe part connected to the other side of the flow cell body part so that the fluid medium is discharged from the flow cell body part,
further comprising a bubble removal unit which is connected to a fluid medium inlet side of the flow cell part and removes bubbles mixed in the fluid medium introduced into the flow cell part,
wherein the bubble removal unit includes:
a bubble discharge line connected to the fluid medium inlet side of the flow cell part; and
a bubble discharge valve installed on the bubble discharge line, and
wherein one side of the bubble discharge line is connected to a circulation pump installed in a circulation flow path so that the bubbles of the bubble discharge line are discharged to the circulation flow path due to a suction pressure of the circulation pump,
wherein a cross-section area of the flow cell body part is greater than a cross-section area of the supply pipe part so that the fluid medium forms a turbulent flow in the flow cell body part,
wherein the supply pipe part includes:
a first supply pipe part through which the fluid medium is supplied; and
a second supply pipe part formed to have a diameter greater than a diameter of the first supply pipe part so that the fluid medium supplied through the first supply pipe part forms a turbulent flow,
further comprising: a light source part and a photodetector part;
further comprising: a first optical part installed to apply light applied from the light source part onto the fluid medium in the flow cell part;
a second optical part installed to apply light, by which a wavelength of the fluid medium is absorbed while passing through the fluid medium in the flow path, to the photodetector part; and
a third supply pipe part extending from the second supply pipe part and connected to the one side of the flow cell body part,
wherein the third supply pipe part is connected to the flow cell body part so as to be inclined with respect to a longitudinal direction of the flow cell body part, and
wherein the flow cell body part is disposed to be inclined upward from the supply pipe part side to the discharge pipe part side, further comprising:
a first collimator part which faces the first optical part and to which a first optical fiber part is connected; and
a second collimator part which faces the second optical part and to which a second optical fiber part is connected.

2. The flow cell device of claim 1, wherein the supply pipe part is connected to a lower side of the flow cell body part, and
the discharge pipe part is connected to an upper side of the flow cell body part.

3. The flow cell device of claim 1,
wherein the first optical part includes:
a first optical slider part disposed on the one side of the flow cell body part;
a first reflective mirror disposed on the first optical slider part to apply light incident from the light source part onto the fluid medium in the flow cell body part; and
a first adjuster installed on the first optical slider part to adjust a position of the first reflective mirror, and wherein the second optical part includes:
a second optical slider part disposed on the other side of the flow cell body part;
a second reflective mirror disposed on the second optical slider part to apply the light absorbing the wavelength of the fluid medium in the flow cell body part to the photodetector part; and
a second adjuster installed on the second optical slider part to adjust a position of the second reflective mirror.

4. The flow cell device of claim 3, wherein the first optical part is disposed on the one side of the flow cell body part to apply the light in a parallel manner with a flow direction of the fluid medium.

5. The flow cell device of claim 1, wherein a separation space is formed inside the housing part to allow an expansion space of the flow cell part.

6. The flow cell device of claim 1, wherein the bubble removal unit further includes a medium discharge valve installed on the bubble discharge line to discharge the fluid medium accommodated in the flow cell part.

* * * * *